United States Patent
Kuromizu et al.

(10) Patent No.: US 7,006,544 B2
(45) Date of Patent: Feb. 28, 2006

(54) PLANE EMISSION TYPE SEMICONDUCTOR LASER DEVICE AND METHOD OF MANUFACTURING THE SAME

(75) Inventors: Yuichi Kuromizu, Kanagawa (JP); Hironobu Narui, Kanagawa (JP); Yoshinori Yamauchi, Kanagawa (JP); Yoshiyuki Tanaka, Kanagawa (JP); Yoshiaki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 126 days.

(21) Appl. No.: 10/835,692

(22) Filed: Apr. 30, 2004

(65) Prior Publication Data

US 2004/0228380 A1 Nov. 18, 2004

(30) Foreign Application Priority Data

May 12, 2003 (JP) ............................. P2003-133306

(51) Int. Cl.
*H01S 5/00* (2006.01)
(52) U.S. Cl. .............................. 372/43; 372/45; 372/46
(58) Field of Classification Search .................. 372/39, 372/43, 44, 45, 46, 49, 50, 80, 96
See application file for complete search history.

(56) References Cited

U.S. PATENT DOCUMENTS

| 5,783,845 | A | 7/1998 | Kondo et al. ............... 257/198 |
| 5,848,086 | A | 12/1998 | Lebby et al. .......... 372/46.013 |
| 5,881,085 | A | 3/1999 | Jewell .................... 372/46.013 |
| 6,075,804 | A | 6/2000 | Deppe et al. .................. 372/96 |
| 6,674,785 | B1 * | 1/2004 | Sato et al. ..................... 372/96 |
| 6,775,310 | B1 * | 8/2004 | Sai et al. ................. 372/45.01 |

(Continued)

FOREIGN PATENT DOCUMENTS

EP    0 529990 A1    3/1993

OTHER PUBLICATIONS

K. D. Choquette, et al., "*Low threshold voltage vertical-cavity lasers fabricated by selective oxidation*", Nov. 24, 1994, Electronics Letters, IEE Stevenage, GB, pp. 2043-2044, XP006001412, ISSN 0013-5194.

(Continued)

*Primary Examiner*—Tuyet Vo
*Assistant Examiner*—Jimmy Vu
(74) *Attorney, Agent, or Firm*—Sonnenschein, Nath & Rosenthal LLP

(57) ABSTRACT

A plane emission type semiconductor laser device includes, on an n-type GaAs stepped substrate, a laminate structure of a lower reflector, a lower clad layer, an active layer, an upper clad layer, an upper reflector, and a p-type contact layer. The stepped substrate includes a circular (100) plane upper level portion, a step portion, and an annular (100) plane lower level portion surrounding the upper level portion with the step portion therebetween. When an AlAs layer is grown as a current confinement layer on the stepped substrate while implanting Si as an n-type impurity into the AlAs layer being grown, the impurity concentration in the AlAs layer on the upper side of the upper level portion is higher than that on the upper side of the step portion, and the oxidation rate of the AlAs layer on the upper side of the upper level portion is lower than that on the upper side of the step portion, so that the progress of oxidation of the AlAs layer on the upper side of the upper level portion is autonomously restrained. By time control of the oxidation reaction of the AlAs layer, it is possible to maintain the circular AlAs layer on the upper side of the upper level portion in an unoxidized state with an accurate shape and an accurate area.

9 Claims, 6 Drawing Sheets

U.S. PATENT DOCUMENTS

| | | | |
|---|---|---|---|
| 6,803,604 B1 * | 10/2004 | Takahashi et al. | 257/80 |
| 2002/0044581 A1 | 4/2002 | Kanebo et al. | 372/46.01 |
| 2002/0074600 A1 | 6/2002 | Wang et al. | 257/347 |
| 2003/0012242 A1 | 1/2003 | Iwai et al. | 372/46.013 |

OTHER PUBLICATIONS

M. Kondo, et al., "Crystal Orientation Dependence of Impurity Dopant Incorporation in MOVPE-grown III-V Materials", Journal of Crystal Growth, North-Holland Publishing Co., Amsterdam, NL, vol. 124, No. 1/4, Nov. 1, 1992, pp. 449-456, XP000411809, ISSN 0022-0248.

J. M. Dallesasse, et al., "Hydrolyzation Oxidation of $Al_xGa_{1-x}AS$-AIAs-GaAs quantum well heterostructures and superlattices", Applied Physics Letters, American Institute of Physics, New York, US, vol. 57, No. 26, Dec. 24, 1990, pp. 2844-2846, XP002051031, ISSSN 0003-6951.

* cited by examiner

F I G. 2 D
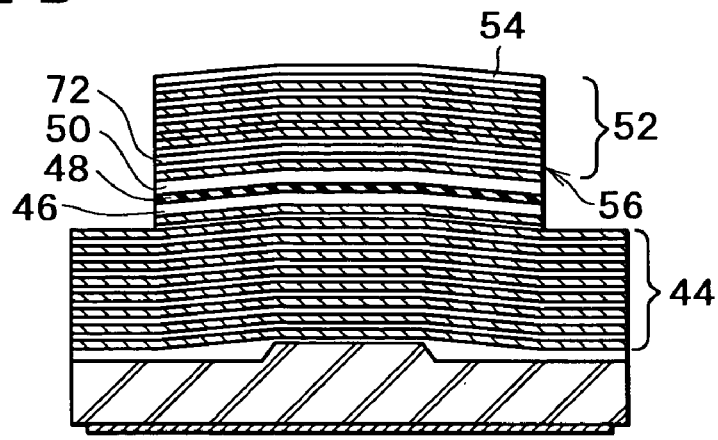
F I G. 2 E
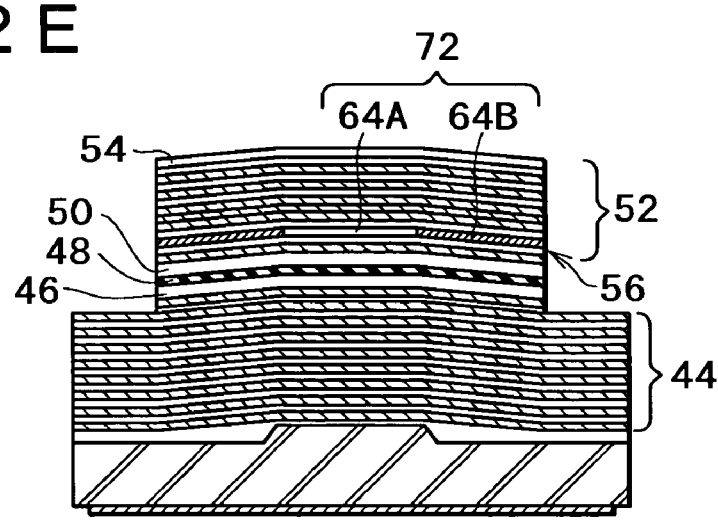
F I G. 2 F
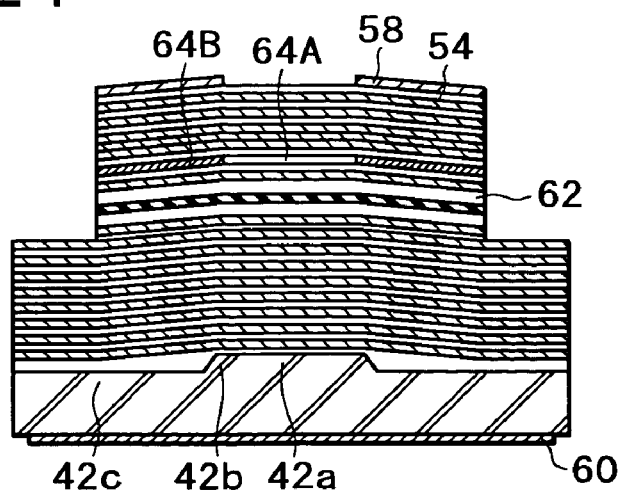

F I G. 5
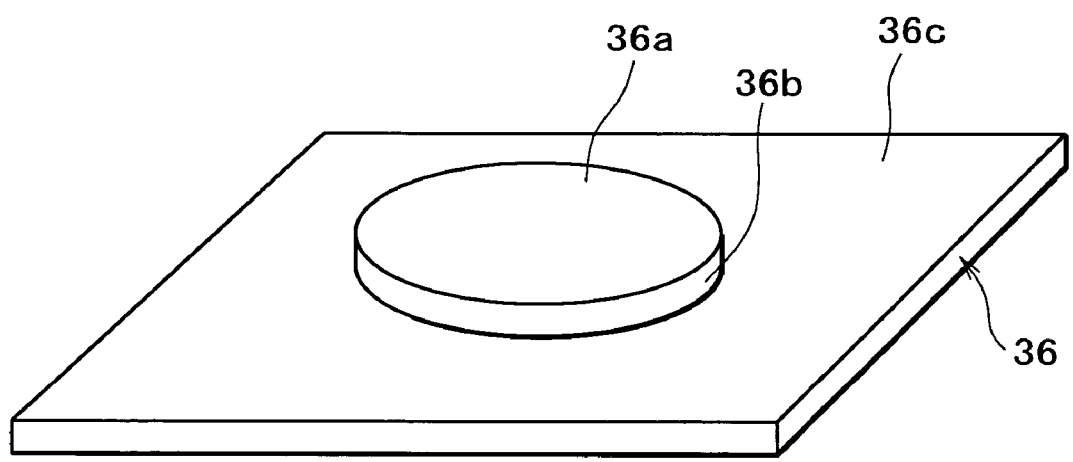

PLANE EMISSION TYPE SEMICONDUCTOR LASER DEVICE AND METHOD OF MANUFACTURING THE SAME

BACKGROUND OF THE INVENTION

The present invention relates to a plane emission type semiconductor laser device and a method of manufacturing the same, particularly to a plane emission type semiconductor laser device including a current confinement layer which is so constituted as to have excellent in-plane uniformity and a method of manufacturing the same.

A plane emission type semiconductor laser device is a semiconductor laser device which includes a pair of reflectors composed of a multiplicity of compound semiconductor layers and an active layer (light emission layer) provided between the reflectors, on a substrate, and which emits a laser beam in a direction orthogonal to the substrate. Since the plane emission type semiconductor laser device is greatly advantageous to mounting, it has been vigorously researched and developed.

In order to enhance the injected current-light output efficiency, the plane emission type semiconductor laser device is provided with a current confinement structure in which the flow path for a current injected from an electrode is confined so as to forcibly inject the current concentratedly into a light emission region of the active layer. Among others, an oxidized confinement type current confinement layer composed of an Al oxide layer formed by oxidizing a high-Al-content layer has been paid attention to, since it is easy to form. The term "oxidized confinement type" means that the oxidized portion is thereby made insulating, i.e, made to block the flow of currents, so that a confinement structure can be formed.

For example, Japanese Patent Laid-open No. 2001-284727 proposes a configuration of a plane emission type semiconductor laser device capable of efficiently emitting a laser beam with a substantially true circular beam profile in a single transverse mode (FIG. 2).

Here, referring to Japanese Patent Laid-open No. 2001-284727, and by using FIG. 3, the configuration of a plane emission type semiconductor laser device having a general oxidized confinement type current confinement structure according to the related art will be described. FIG. 3 is a sectional view showing the configuration of the plane emission type semiconductor device having the general oxidized confinement type current confinement structure according to the related art.

As shown in FIG. 3, the conventional plane emission type semiconductor laser device 10 includes, on an n-type semiconductor substrate 12, a laminate structure of a lower reflector 14 composed of a multiplicity of n-type compound semiconductor layers, a lower clad layer 16, an active layer 18, an upper clad layer 20, an upper reflector composed of a multiplicity of p-type compound semiconductor layers, and a p-type contact layer 24.

Of the laminate structure, the contact layer 24, the upper reflector 22, the upper clad layer 20, the active layer 18, the lower clad layer 16, and an extreme upper portion of the lower reflector 14 are formed as a mesa post 26.

In addition, a p-side electrode 28 is provided on the p-type contact layer 24, while an n-side electrode 30 is provided on the back side of the n-type semiconductor substrate 12, and an insulation film 32 is formed on the side surface of the mesa post 26 and on the lower reflector 14 in the vicinity of the mesa post 26.

In a layer, near the active layer 18, of the upper reflector 22, there is formed a current confinement layer 34 in place of the compound semiconductor layer constituting the upper reflector 22. The current confinement layer 34 is constituted of a high-Al-content layer 34A present in a central region, and an Al oxide layer 34B formed in an annular shape along the circumference of the mesa post 26 so as to surround the high-Al-content layer 34A.

The Al oxide layer 34B is an $AlO_x$ layer formed by selective oxidation of a high-Al-content layer such as an AlAs layer, a high-Al-content AlGaAs layer (Al content>0.95), etc., and constitutes a current confinement region which has a high electric resistance. The high-Al-content layer 34A is an unoxidized AlAs layer or high-Al-content AlGaAs layer (Al content>0.95), and constitutes a current injection region which is lower than the Al oxide layer 34B in electric resistance.

With the above-mentioned configuration, an electric current injected from the p-side electrode 28 toward the n-side electrode 30 is confined by the current confinement region 34B, passes through the current injection region 34A, and flows locally concentratedly into a light emission region of the active layer 18, to generate an inverted distribution of carriers in the active layer 18, whereby laser oscillation can be effected.

At the time of manufacturing the plane emission type semiconductor laser device 10, first, the laminate structure of the lower reflector 14, the lower clad layer 16, the active layer 18, the upper clad layer 20, the upper reflector 22 including the high-Al-content layer, and the p-type contact layer 24 is formed on the n-type semiconductor substrate 12, and then the laminate structure is etched to form the mesa post 26.

Subsequently, the laminate structure provided with the mesa post 26 is fed into an electric furnace filled with a water vapor atmosphere, and is heated to about 400° C. to oxidize the high-Al-content layer inwards from the circumference of the mesa post 26, whereby the annular Al oxide layer 34B is formed while leaving the unoxidized high-Al-content layer 34A in the central region as the current injection region.

Meanwhile, a high-Al-content layer such as an AlAs layer intrinsically has a high electric resistance, even though it is not oxidized. Therefore, in determining the device resistance of the plane emission type semiconductor laser device, it is necessary to control the area of the unoxidized high-Al-content layer (current injection region) to a predetermined area.

Accordingly, in order to control the area of the current injection region to the predetermined area, it is necessary to control the oxidation width of the Al oxide layer, i.e., the oxidation width of the annular oxide film formed along the circumference of the mesa post. In addition, in order to control the transverse mode of the light emitted from the plane emission type semiconductor laser device, also, it is necessary to control the oxidation width of the Al oxide layer.

At the time of oxidizing the high-Al-content layer such as an AlAs layer, as above-mentioned, the laminate structure of the compound semiconductor layers is etched to form an air post type mesa post, and the water vapor oxidation reaction of the high-Al-content layer is made to proceed inwards from the side surface of the mesa post.

According to the conventional method, however, the control of the oxidation width is carried out by controlling the reaction time, and, therefore, the repetitive reproducibility of the oxidation width and in-plane uniformity have not necessarily been satisfactory; generally, the repetitive reproducibility of the oxidation width has been about ±1 μm, and the in-plane distribution has also been about ±1 μm.

For control of the device resistance and the transverse mode, generally, it is necessary to control the oxidation width to a predetermined value in the range of from several micrometers to ten and several micrometers. However, since the repetitive reproducibility of the oxidation width has been about ±1 μm and the in-plane distribution has been about ±1 μm, it has been difficult to form a current confinement region with an accurate oxidation width, i.e., a current confinement layer having a current injection region with a predetermined area.

According to the related art, therefore, the laser characteristics of the plane emission type semiconductor laser device would be scattered, and it is difficult to enhance the yield of the product.

SUMMARY OF THE INVENTION

Accordingly, it is an object of the present invention to provide a plane emission type semiconductor laser device including an oxidized confinement type current confinement layer which is so constituted as to have good repetitive reproducibility and controllability, and a method of manufacturing the same.

The present inventors, in the process of their research for realizing an oxidized confinement type current confinement layer so constituted as to have good repetitive reproducibility and controllability, paid attention to the relationship between the oxidation rate in a water vapor oxidation reaction of an AlAs layer and the film thickness of the AlAs layer.

Then, the present inventors paid attention to the fact that, as shown in FIG. 4, the oxidation rate in the water vapor oxidation reaction of the AlAs layer depends on the film thickness of the AlAs layer and rapidly decreases at the film thickness of the AlAs layer decreases to below 40 nm. FIG. 4 shows the relationship while taking the film thickness (nm) of the AlAs layer on the axis of abscissas and taking the normalized rate of oxidation of the AlAs layer, with the oxidation rate of the AlAs layer when the film thickness of the AlAs layer is 70 nm being taken as 1, on the axis of ordinates. The figures affixed to the squares indicate the oxidation rate of the AlAs layer.

Then, as will be described below, the present inventors have found out that the film thickness of the AlAs layer is about 40 nm and that the scattering of the oxidation width of the current confinement layer is generated because the oxidation rate of the AlAs layer rapidly varies with the film thickness of 40 nm as a boundary, as seen from FIG. 4.

Generally, the film thickness of the AlAs layer must be not more than 40 nm, in order to prevent mesa exfoliation by restraining the generation of stress arising from volume expansion of the Al oxide layer upon water vapor oxidation. However, it is technically difficult to form an AlAs layer having a small film thickness of 40 nm or below with good in-plane uniformity of film thickness, and, therefore, the AlAs layer obtained has a bad in-plane uniformity of film thickness.

Therefore, the in-plane uniformity of oxidation rate of the AlAs layer, which depends on the film thickness of the AlAs layer, is also bad. Moreover, the oxidation rate of the AlAs layer rapidly varies with the film thickness of 40 nm as a boundary. Accordingly, it is difficult to oxidize the AlAs layer with good in-plane uniformity of oxidation width. As a result, the device characteristics of the plane emission type semiconductor laser device are scattered, and it is difficult to enhance the yield of the product.

Meanwhile, the oxidation rate in the water vapor oxidation reaction of a high-Al-content layer such as an AlAs layer and an AlGaAs layer is greatly affected not only by the film thickness of the high-Al-content layer but also by the impurity concentration in the high-Al-content layer. For example, where the impurity implanted into the high-Al-content layer is an n-type dopant such as Si and Se, the oxidation rate of the high-Al-content layer tends to be lower as the impurity concentration is higher. On the contrary, where the impurity implanted into the high-Al-content layer is a p-type dopant such as Zn, the oxidation rate tends to be higher as the impurity concentration is higher.

Besides, under the growth conditions in an ordinary MOCVD process, the amount of an n-type dopant such as Si and Se or the amount of a p-type dopant such as Zn taken into a high-Al-content layer on a minutely inclined substrate which is minutely inclined against the (100) plane tends to be smaller, as compared with the amount of the same dopant taken into a high-Al-content layer on the (100) plane.

On the other hand, when a high-Al-content layer is epitaxially grown on a stepped substrate in which an upper level portion with a (100) plane as its top face is provided on a higher level than a lower level portion with a step portion therebetween, the step portion is minutely inclined against the (100) plane and, therefore, the growth direction of the crystal grown on the step portion is minutely inclined against the (100) plane.

Accordingly, when an impurity is implanted into the high-Al-content layer while growing the high-Al-content layer on the stepped substrate, the crystal of the high-Al-content layer grown on the step portion has an impurity concentration lower than that in the crystal of the high-Al-content layer grown on the flat (100) plane of the upper level portion.

For example, when a trace amount of an n-type impurity is implanted into the growing high-Al-content layer at the time of growing the high-Al-content layer on the stepped substrate, > (the n-type impurity concentration in the high-Al-content layer grown on the (100) plane of the upper level portion)>(the n-type impurity concentration in the high-Al-content layer grown on the step portion).

Therefore, when the high-Al-content layer is subjected to water vapor oxidation, due to the fact that the n-type impurity concentration in the high-Al-content layer grown on the (100) plane of the upper level portion is higher than the n-type impurity concentration in the high-Al-content layer grown on the inclined layer on the step portion, > (the oxidation rate of the high-Al-content layer grown on the (100) plane of the upper level portion)<(the oxidation rate of the high-Al-content layer grown on the step portion).

Namely, the oxidation rate of the high-Al-content layer grown on the step portion is higher than the oxidation rate of the high-Al-content layer grown on the (100) plane of the upper level portion.

In view of the foregoing, when an n-type impurity is implanted at the time of growing the high-Al-content layer to convert the high-Al-content layer on the (100) plane of the upper level portion into a current injection region and to oxidize the high-Al-content layer on the step portion so as to form a current confinement region composed of an Al oxide layer, the high-Al-content layer on the step portion is oxidized comparatively faster, and the oxidation rate is abruptly decreased when the oxidation reaches the high-Al-content layer on the upper level portion. Therefore, the progress of the oxidation of the high-Al-content layer is autonomously restrained, which increases the margin as to the time control of the oxidation reaction.

As a result, it becomes easy to perform time control of the oxidation of the high-Al-content layer even if the film thickness distribution of the high-Al-content layer in the wafer plane is somewhat bad, and it becomes possible to control the oxidation width of the Al oxide layer with a remarkably better in-plane uniformity, as compared with that in the related art.

Then, the present inventors have thought to control the oxidation width of a current confinement layer in the manner as follows.

First, as shown in FIG. 5, a GaAs substrate having a (100) plane as a major surface thereof is etched, to form a stepped substrate 36 which includes an upper level portion 36a having the same size as the current confinement diameter of the current confinement layer (the diameter of the current injection region) and a step of about several micrometers to sub micrometers, and a lower level portion 36c annularly surrounding the upper level portion 36a, with a step portion 36b therebetween.

Next, a laminate structure including a high-Al-content layer is formed on the stepped substrate 36. At the time of growing the high-Al-content layer, an n-type impurity is implanted into the high-Al-content layer being grown, to generate a difference in n-type impurity concentration between the high-Al-content layer on the step portion 36b and the high-Al-content layer on the (100) plane of the upper level portion 36a.

By the above procedure, a difference in the rate of oxidation reaction is generated between the high-Al-content layer on the step portion and the high-Al-content layer on the upper level portion, whereby the oxidation width of the Al oxide layer is controlled.

The present inventors have confirmed, by experiments, that when a stepped substrate is formed by photolithography and etching, the repetitive reproducibility in formation of a step portion can be enhanced and, hence, the repetitive reproducibility of the oxidation width of the Al oxide layer can be enhanced to about ±0.1 µm. Based on the confirmation, the present invention has been made.

In accordance with one aspect of the present invention, there is provided a plane emission type semiconductor laser device including a lower reflector, a light emission layer, and an upper reflector having a current confinement layer, wherein the plane emission type semiconductor laser device is formed on a stepped substrate including an upper level portion, a step portion, and a lower level portion lower than the upper level portion and surrounding the upper level portion with the step portion therebetween, the current confinement layer includes, on the upper side of the upper level portion of the stepped substrate, a current injection region included of an unoxidized high-Al-content layer having substantially the same shape as the plan-view shape of the upper level portion and substantially the same size as the size of the upper level portion, the current confinement layer includes, as a current confinement region, an annular Al oxide layer obtained by oxidizing the high-Al-content layer around the current injection region, and the high-Al-content layer is doped with an n-type impurity in an impurity concentration of $1\times10^{17}$ to $1\times10^{18}$ cm$^{-3}$.

In the present invention, the n-type impurity is implanted into the high-Al-content layer which is a current confinement region forming layer at the time of forming the high-Al-content layer, and the progress of oxidation of the high-Al-content layer on the upper side of the upper level portion is autonomously controlled by utilizing the fact that the rate of oxidation reaction of the high-Al-content layer is dependent on the n-type impurity concentration.

To be more specific, when the n-type impurity is implanted into the high-Al-content layer at the time of forming the high-Al-content layer, the concentration of the n-type impurity in the high-Al-content layer on the upper side of, for example, a (100) plane on the upper level portion is higher than the concentration of the n-type impurity in the high-Al-content layer on the upper side of the step portion. Therefore, at the time of water vapor oxidization of the high-Al-content layer, the rate of oxidation reaction of the high-Al-content layer on the upper side of the upper level portion is lower than the rate of oxidation reaction of the high-Al-content layer on the upper side of the step portion, so that the high-Al-content layer on the upper side of the step portion is oxidized comparatively faster, and the oxidation rate is abruptly lowered when the oxidation reaches the high-Al-content layer on the upper side of the upper level portion. As a result, the progress of oxidation of the high-Al-content layer on the upper side of the upper level portion is autonomously restrained, which increases the margin as to time control of the oxidation reaction.

By this, it becomes easy to perform time control of the oxidation of the high-Al-content layer on the upper side of the upper level portion. Therefore, even if the film thickness distribution of the high-Al-content layer in a wafer plane is somewhat bad, it is possible to control the oxidation width of the Al oxide layer on the outside of the upper level portion with a remarkably better in-plane uniformity, as compared with that in the related art.

Accordingly, by using the high-Al-content layer on the upper side of, for example, the (100) plane on the upper level portion as a current injection region and using the Al oxide layer on the upper side of the step portion as a current confinement region, it is possible to form a current confinement layer having a controlled current injection region.

In a preferred embodiment of the present invention, the upper level portion of the stepped substrate is present at a height of 0.1 to 5 µm from the lower level portion, with the step portion therebetween. In addition, each of the upper level portion and the lower level portion has a (100) plane as a top face thereof.

With this configuration, each of the compound semiconductor layers constituting the laminate structure is grown as flat layers on the upper side of the upper level portion and the lower level portion of the stepped substrate, and is grown as an inclined layer continuous to the flat layers on the upper side of the step portion of the stepped substrate.

In the present invention, specifically, the stepped substrate is a GaAs substrate, and the high-Al-content layer is an $Al_xGa_{(1-x)}As$ layer ($1 \geq x > 0.95$).

In accordance with another aspect of the present invention, there is provided a method of manufacturing a plane emission type semiconductor laser device including a lower reflector, a light emission layer, and an upper reflector having a current confinement layer, including the steps of:

etching a substrate having a (100) plane as a major surface, to form a stepped substrate which includes an upper level portion having the (100) plane as the top face thereof, the upper level portion having substantially the same shape and the same size as those of a current injection region of the current confinement layer, a step portion, and an annular lower level portion having the (100) plane, the lower level portion surrounding the upper level portion with the step portion therebetween, and epitaxially growing sequentially, on the stepped substrate, compound semiconductor layers for respectively constituting the lower reflector, the light emission layer, and the upper reflector having a high-Al-content layer, to form a laminate structure of the compound semiconductor layers in which each of the compound semiconductor layers is grown as flat layers on the upper side of the upper level portion of the stepped substrate and on the upper side of the lower level portion of the stepped substrate and is grown as an inclined layer continuous with the flat layers on the upper side of the step portion of the stepped substrate, wherein an n-type impurity is implanted into the high-Al-content layer at the time of growing the high-Al-content layer, and the method further includes the steps of:

etching the upper reflector, the light emission layer, and an upper portion of the lower reflector, of the laminate structure formed, to form a mesa post, and subjecting the high-Al-content layer of the upper reflector to water vapor oxidation, to form an annular Al oxide layer extending inwards from the side surface of the mesa post and to maintain the high-Al-content layer in an unoxidized state in a central region corresponding to the upper level portion of the stepped substrate.

In the step of forming the laminate structure, at the time of implanting the n-type impurity into the high-Al-content layer being grown, the impurity concentration of the n-type impurity in the high-Al-content layer grown as a flat layer on the upper side of the upper level portion is higher than the impurity concentration of the n-type impurity in the high-Al-content layer grown as an inclined layer on the upper side of the step portion.

In the method according to the present invention, the n-type impurity is implanted into the high-Al-content layer which is a current confinement region forming layer at the time of forming the high-Al-content layer, and the progress of oxidation of the high-Al-content layer on the upper side of the upper level portion is autonomously controlled by utilizing the fact that the rate of oxidation reaction of the high-Al-content layer is dependent on the n-type impurity concentration.

To be more specific, when the n-type impurity is implanted into the high-Al-content layer at the time of forming the high-Al-content layer, the concentration of the n-type impurity in the high-Al-content layer on the upper side of the step portion is lower than the concentration of the n-type impurity in the high-Al-content layer on the upper side of the upper level portion, so that the rate of oxidation reaction of the high-Al-content layer on the upper side of the step portion is higher than the rate of oxidation reaction of the high-Al-content layer on the upper side of the upper level portion.

Therefore, the high-Al-content layer on the upper side of the step portion is oxidized comparatively faster, and the oxidation rate is abruptly lowered when the oxidation reaches the high-Al-content layer on the upper side of the upper level portion. Accordingly, the progress of the oxidation of the high-Al-content layer is autonomously restrained, which increases the margin as to time control of the oxidation reaction.

As a result, it becomes easy to perform time control of the oxidation of the high-Al-content layer on the upper side of the upper level portion, so that, even if the film thickness distribution of the high-Al-content layer in a wafer plane is somewhat bad, it is possible to control the oxidation width of the Al oxide layer on the outside of the upper level portion with a remarkably better in-plane uniformity, as compared with that in the related art.

Therefore, by using the high-Al-content layer on the upper side of the (100) plane of the upper level portion as a current injection region and using the Al oxide layer on the upper side of the step portion as a current confinement region, it is possible to form a current confinement layer having a controlled current injection region.

Besides, with the stepped substrate formed by photolithography and etching, the repetitive reproducibility in the formation of the step portion is enhanced and, hence, the repetitive reproducibility of the oxidation width of the Al oxide layer can be enhanced to about ±0.1 μm.

BRIEF DESCRIPTION OF THE DRAWINGS

The above and other objects, features and advantages of the present invention will become apparent from the following description and appended claims, taken in conjunction with the accompanying drawings, in which:

FIGS. 2D to 2F are sectional views of the substrate for illustrating individual steps, following to FIG. 2C, in manufacturing the plane emission type semiconductor laser device by the method according to the embodiment of the present invention;

FIG. 5 is a perspective view showing the configuration of a stepped substrate.

DETAILED DESCRIPTION OF THE PREFERRED EMBODIMENTS

Now, referring to the accompanying drawings, the present invention will be described more in detail below, based on embodiments thereof. The conduction type, kinds of films, film thicknesses, methods of forming films, sizes and the like are just examples for easy understanding of the present invention, and the invention is not limited to or by these examples.

Embodiment of Plane Emission Type Semiconductor Laser Device

Figure 1:
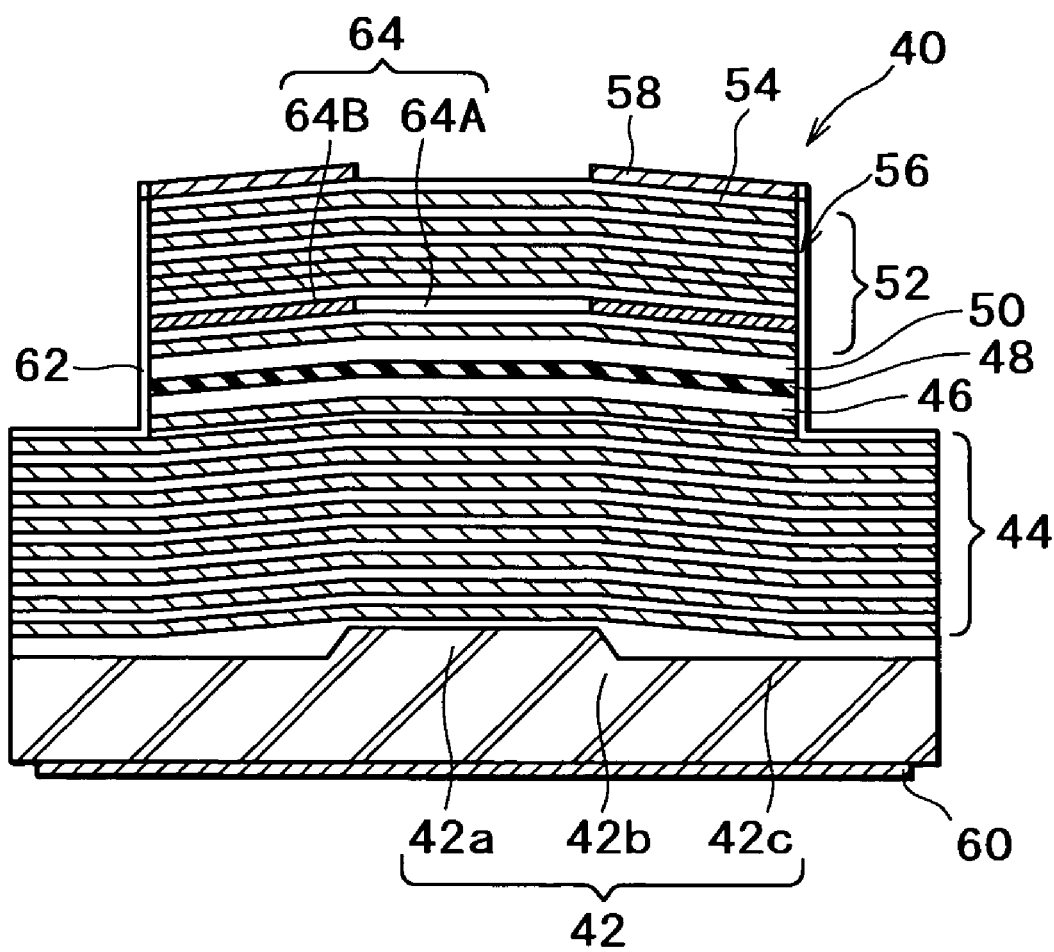
FIG. 1 is a sectional view showing the configuration of a plane emission type semiconductor laser device according to an embodiment of the present invention.

This embodiment is an example of embodiment of a plane emission type semiconductor laser device according to the present invention, and FIG. 1 is a sectional view showing the configuration of the plane emission type semiconductor laser device according to the embodiment.

The plane emission type semiconductor laser device 40 in this embodiment includes, on an n-type GaAs stepped substrate 42, a laminate structure of a lower reflector 44, a non-doped $Al_{0.5}Ga_{0.5}As$ lower clad layer 46 with a film thickness of 100 nm, an active layer 48, a non-doped $Al_{0.5}Ga_{0.5}As$ upper clad layer 50 with a film thickness of 100 nm, an upper reflector 52, and a p-type GaAs contact layer 54 with an impurity concentration of not less than $1\times10^{19}/cm^3$.

The n-type GaAs stepped substrate 42 is included of a circular (100) plane upper level portion 42a with a diameter of 10 μm, a step portion 42b with a height of 1 μm, and an annular (100) plane lower level portion 42c surrounding the upper level portion 42a with the step portion 42b therebetween.

Therefore, each of compound semiconductor layers epitaxially grown on the stepped substrate 42 includes flat layers grown on the upper side of the upper level portion 42a and the lower level portion 42c, and an inclined layer grown on the upper side of the step portion 42b in continuation with the flat layers, as shown in FIG. 1.

The active layer 48 is included of a non-doped $Al_{0.3}Ga_{0.7}As$ optical guide layer with a film thickness of 10 nm, a triple quantum well structure constituted of a non-doped GaAs layer with a film thickness of 7 nm and a non-doped $Al_{0.3}Ga_{0.7}As$ layer with a film thickness of 5 nm, and a non-doped $Al_{0.3}Ga_{0.7}As$ optical guide layer with a film thickness of 10 nm.

The lower reflector 44 is formed as a multi-layer film composed of a plurality of pairs of an n-type $Al_{0.2}Ga_{0.8}As$ layer and an n-type $Al_{0.92}Ga_{0.08}GaAs$ layer, with an intermediate layer therebetween which has a film thickness of 100 Å and an Al content increased from 0.2 to 0.92, each of the layers having an n-type impurity concentration of about $2\times10^{18}/cm^3$.

The upper reflector 52 is formed as a multi-layer film composed of a plurality of pairs of a p-type $Al_{0.2}Ga_{0.8}As$ layer and a p-type $Al_{0.92}Ga_{0.08}As$ layer, with an intermediate layer therebetween which has a film thickness of 100 Å and an Al content increased from 0.2 to 0.92, each of the layers having a p-type impurity concentration of about $2\times10^{18}/cm^3$.

Of the laminate structure, the p-type GaAs contact layer 54, the upper reflector 52, the upper clad layer 50, the active layer 48, the lower clad layer 46, and an extreme upper portion of the lower reflector 44 are formed as a mesa post 56.

In addition, a p-side electrode 58 is provided on the p-type contact layer 54, while an n-side electrode 60 is provided on the back side of the n-type GaAs stepped substrate 42, and an insulation film 62 is formed on the side surface of the mesa post 56 and on the lower reflector 44 around the mesa post 56.

Besides, in the upper reflector 52, at a position on the upper side of the upper clad layer 50 with two pairs of layers therebetween, there is provided a current confinement layer 64 in place of the AlGaAs layer constituting the upper reflector 52.

The current confinement layer 64 is included of an unoxidized AlAs layer 64A left in a central region upon water vapor oxidation of an AlAs layer with a film thickness of 30 nm which is formed in place of the AlGaAs layer constituting the upper reflector 52, and an annular Al oxide layer 64B formed on the outside of the AlAs layer 64 by water vapor oxidation of the AlAs layer 64 inwards from the side surface of the mesa post 56. Besides, at the time of forming the AlAs layer, an n-type impurity, for example, Si is implanted into the AlAs layer in an impurity concentration of $1\times10^{18}$ cm$^{-3}$.

The unoxidized AlAs layer 64A is a circular region having a diameter equal to the diameter of the upper level portion 42a of the GaAs stepped substrate 42, and functions as a current injection region. On the other hand, the Al oxide layer 64B functions as a current confinement region having a high electric resistance.

In this embodiment, the AlAs layer is grown as the current confinement layer 64 on the upper side of the GaAs stepped substrate 42, and, during the growth of the AlAs layer, Si as an n-type impurity is implanted into the AlAs layer. As a result, a difference in n-type impurity concentration is generated between the AlAs layer on the upper side of the step portion 42b and the AlAs layer on the upper side of the upper level portion 42a, and the impurity concentration in the AlAs layer on the upper side of the upper level portion 42a is higher than the impurity concentration in the AlAs layer on the upper side of the step portion 42b.

Therefore, the oxidation rate of the AlAs layer on the upper side of the upper level portion 42a is lower than the oxidation rate of the AlAs layer on the upper side of the step portion 42b, so that the oxidation reaction apparently stops when the oxidation reaction reaches the AlAs layer on the upper side of the upper level portion 42a and, hence, the progress of oxidation of the AlAs layer on the upper side of the upper level portion 42a is autonomously restrained. Accordingly, it becomes easy to perform time control of the oxidation reaction.

Therefore, by time control of the oxidation reaction of the AlAs layer, it is possible to maintain the circular AlAs layer on the upper side of the upper level portion 42a in an unoxidized state with an accurate shape and an accurate area. This makes it possible to enhance the in-plane uniformity of oxidation width.

In view of the foregoing, by using the AlAs layer 64A on the upper side of the upper level portion 42a as the current injection region and using the Al oxide layer 64B on the upper side of the step portion 42b as the current confinement region, it is possible to form a current confinement layer having a controlled current injection region.

Embodiment of Method of Manufacturing Plane Emission Type Semiconductor Laser Device This embodiment is an example of embodiment in which a method of manufacturing a plane emission type semiconductor laser device according to the present invention is applied to the manufacture of the plane emission type semiconductor laser device according to the above embodiment. FIGS. 2A to 2C and FIGS. 2D to 2F are sectional views of a substrate for illustrating the individual steps in manufacturing the plane emission type semiconductor device by the method according to this embodiment.

Figure 2A:
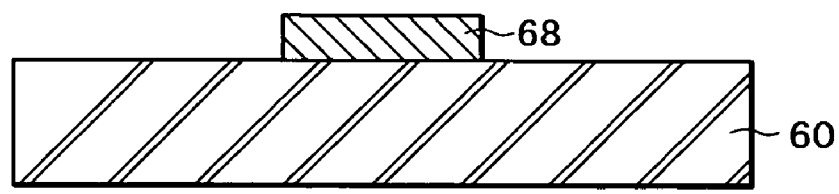
FIGS. 2A to 2C are sectional views of a substrate for illustrating individual steps in manufacturing a plane emission type semiconductor laser device by a method according to an embodiment of the present invention.

In this embodiment, first, as shown in FIG. 2A, an etching mask 68 having a circular pattern with a diameter of 10 μm is formed on an n-type GaAs substrate 66 having a (100) plane as a major surface thereof.

Figure 2B:
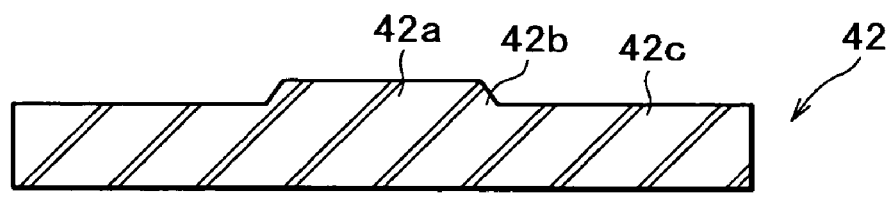

Next, the n-type GaAs substrate 66 is etched by a dry etching method using the etching mask 68, to form an n-type GaAs stepped substrate 42 which includes, as shown in FIG. 2B, a circular (100) plane upper level portion 42a with a diameter of 10 μm, a step portion 42b with a height of 1 μm, and an annular (100) plane lower level portion 42c surrounding the upper level portion 42a with the step portion 42b therebetween.

Figure 2C:
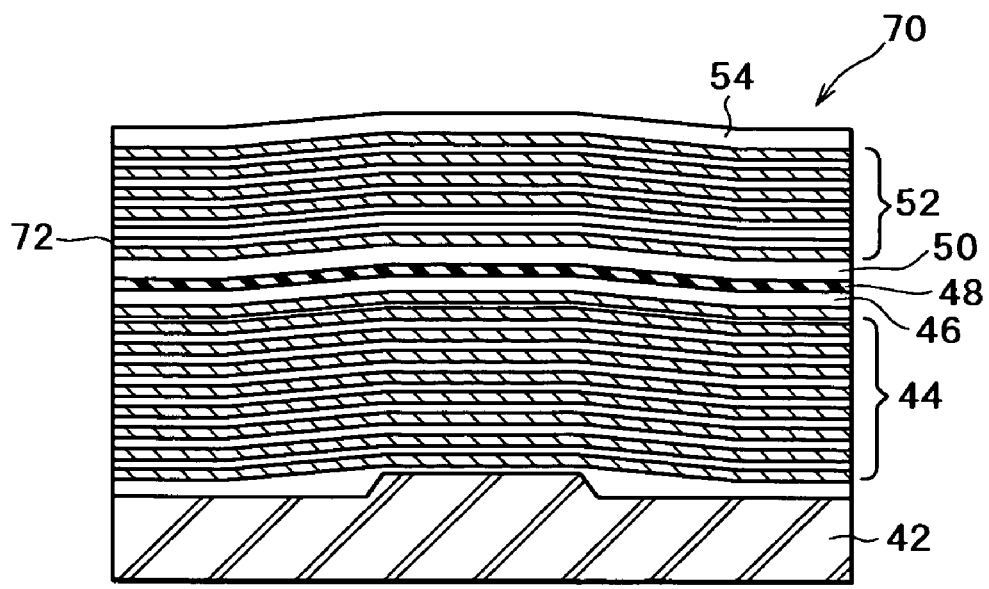
Figure 3:
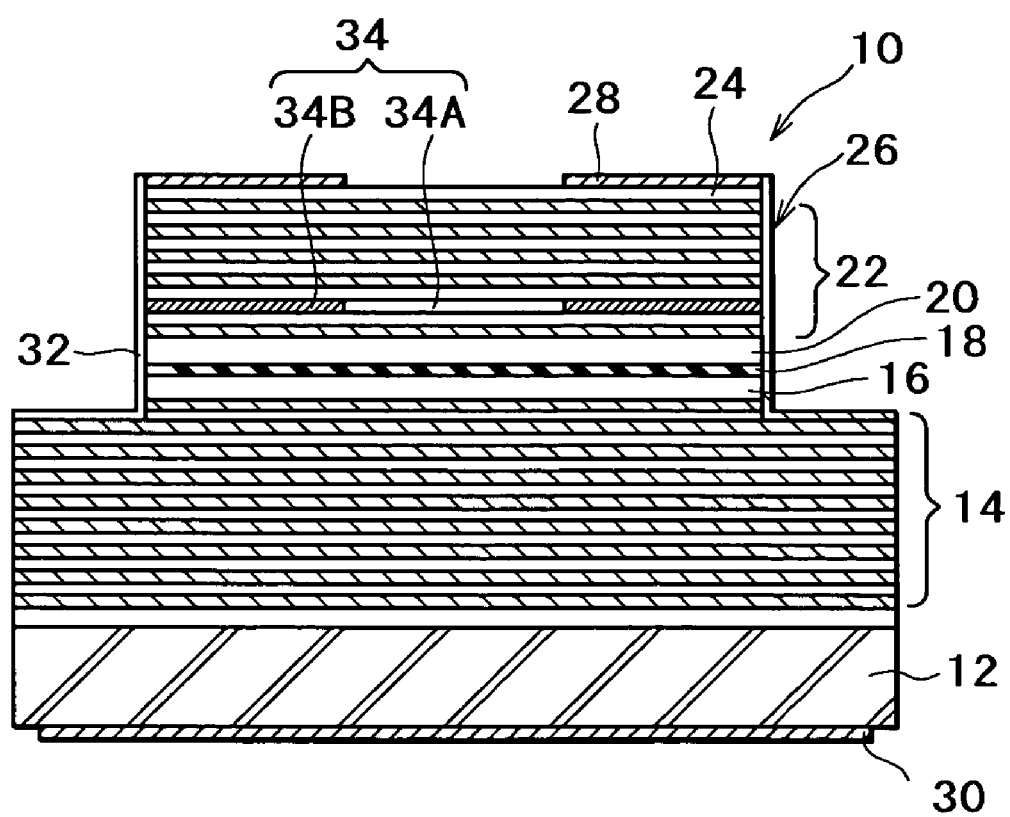
FIG. 3 is a sectional view showing the configuration of a plane emission type semiconductor laser device according to the related art.
Figure 4:
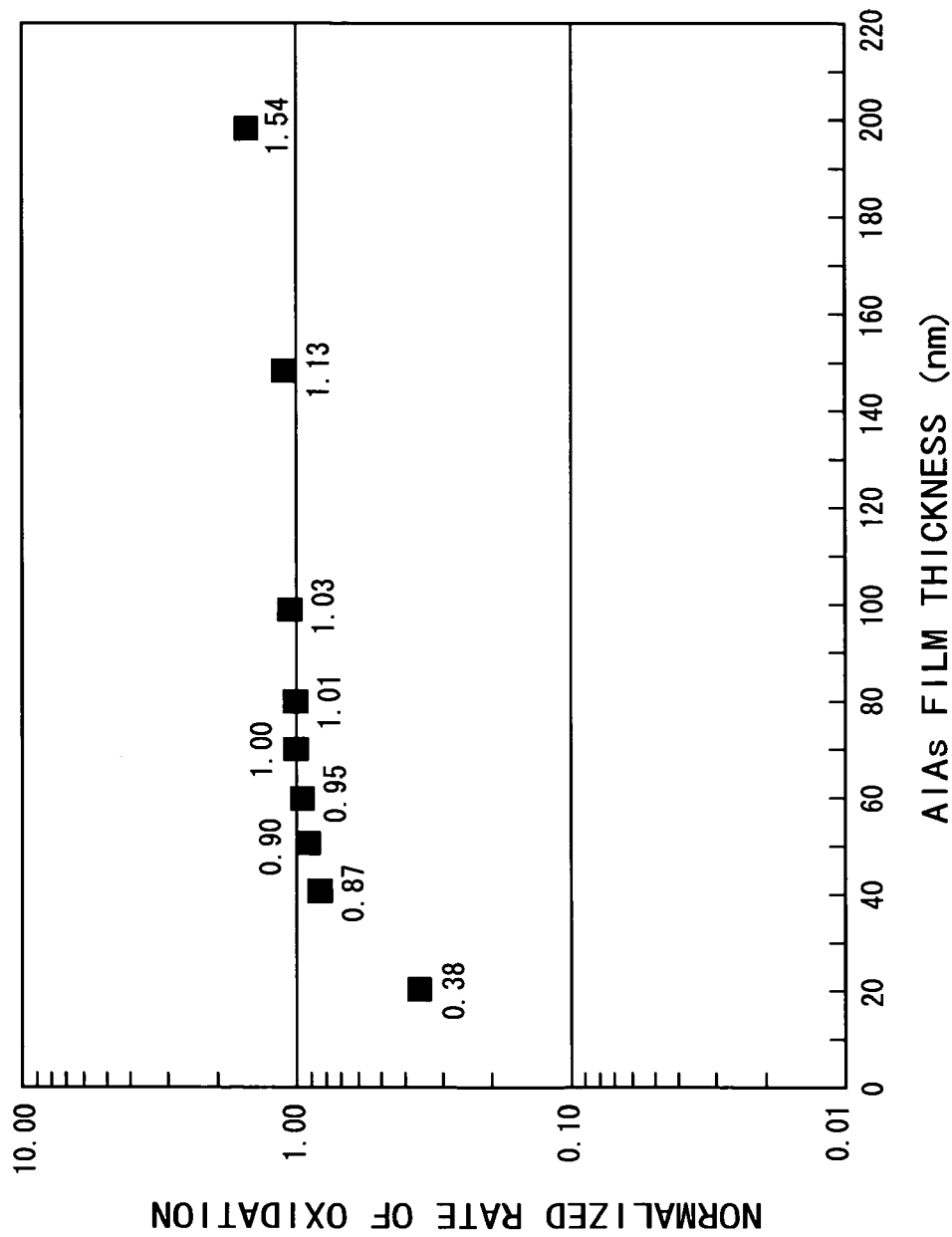
FIG. 4 is a graph showing the relationship between the film thickness of an AlAs layer and the oxidation rate of the AlAs layer.

Next, a lower reflector 44, a non-doped $Al_{0.5}Ga_{0.5}As$ lower clad layer 46 with a film thickness of 100 nm, an active layer 48, a non-doped $Al_{0.5}Ga_{0.5}As$ upper clad layer 50 with a film thickness of 100 nm, an upper reflector 52, and a p-type GaAs contact layer 54 with an impurity concentration of $1\times10^{19}/cm^3$ are sequentially grown on the n-type GaAs stepped substrate 42 by an MOCVD method, to form a laminate structure 70 as shown in FIG. 2C.

In this embodiment, the compound semiconductor layers are epitaxially grown on or on the upper side of the stepped substrate 42, so that, as shown in FIG. 2C, each of the compound semiconductor layers is grown as flat layers on the upper side of the upper level portion 42a and on the upper side of the lower level portion 42c and is formed as an inclined layer continuous with the flat layers on the upper side of the step portion 42b.

In the formation of the lower reflector 44, a multi-layer film composed of a plurality of pairs of an n-type $Al_{0.2}Ga_{0.8}As$ layer and an n-type $Al_{0.92}Ga_{0.08}As$ layer, with an intermediate layer therebetween which has a film thickness of 100 Å and an Al content increased from 0.2 to 0.92, is epitaxially grown. Besides, each of the layers has an n-type impurity concentration of about $2\times10^{18}/cm^3$.

In the formation of the active layer 48, a non-doped $Al_{0.3}Ga_{0.7}As$ optical guide layer with a film thickness of 10 nm, a triple quantum well structure constituted of a non-doped GaAs layer with a film thickness of 7 nm and a non-doped $Al_{0.3}Ga_{0.7}As$ layer with a film thickness of 5 nm, and a non-doped $Al_{0.3}Ga_{0.7}As$ optical guide layer with a film thickness of 10 nm are sequentially epitaxially grown on the lower clad layer 46.

In the formation of the upper reflector 52, a multi-layer film composed of a plurality of pairs of a p-type $Al_{0.2}Ga_{0.8}As$ layer and a p-type $Al_{0.92}Ga_{0.08}As$ layer, with an intermediate layer therebetween which has a film thickness of 100 Å and an Al content increased from 0.2 to 0.92, is epitaxially grown. Besides, each of the layers has a p-type impurity concentration of about $2\times10^{18}/cm^3$.

In the formation of the upper reflector 52, at a position on the upper side of the upper clad layer 50 with two pairs of layers therebetween, an AlAs layer 72 is epitaxially grown in place of the AlGaAs layer constituting the upper reflector 52. In the formation of the AlAs layer 72, Si as an n-type impurity is implanted into the AlAs layer 72 in an impurity concentration of $1\times10^{18}$ cm$^{-3}$.

Next, of the laminate structure 70, the p-type GaAs contact layer 54, the upper reflector 52 including the AlAs layer 72, the upper clad layer 50, the active layer 48, the lower clad layer 46, and an extreme upper portion of the lower reflector 44 are etched, to form a mesa post 56 as shown in FIG. 2D.

Subsequently, the laminate structure 70 formed to be the mesa post 56 is subjected to water vapor oxidation under the conditions of an oxidation temperature of 400 to 450° C., a water vapor flow rate of 0.5 g/min, and an $N_2$ carrier gas flow rate of 10 to 20 l/min.

By this, as shown in FIG. 2E, the AlAs layer 72 is oxidized in water vapor inwards from the side surface of the mesa post 56, upon which the AlAs layer 72 on the upper side of the lower level portion 42c and the step portion 42b of the GaAs stepped substrate 42 constitutes an annular Al oxide layer 64B, while the AlAs layer 72 on the upper side of the upper level portion 42a constitutes an AlAs layer 64A left in an unoxidized state in a central region.

The unoxidized AlAs layer 64A is a circular region having a diameter equal to the diameter of the upper level portion 42a of the GaAs stepped substrate 42, and functions as a current injection region. On the other hand, the Al oxide layer 58B functions as a current confinement region having a high electric resistance.

Next, an insulation film 62 is formed on the entire surface of the substrate, then the insulation film 62 on the mesa post 56 is removed to expose the p-type GaAs contact layer 54, a p-side electrode 58 is provided on the p-type GaAs contact layer 54, the back side of the n-type GaAs stepped substrate 42 is polished to regulate the thickness of the substrate to a predetermined value, and an n-side electrode 60 is formed thereon.

In this embodiment, the AlAs layer is grown as a current confinement layer 64 on the upper side of the GaAs stepped substrate 42, and, during the growth of the AlAs layer, Si as an n-type impurity is implanted into the AlAs layer. As a result, a difference in n-type impurity concentration is generated between the AlAs layer on the upper side of the step portion 42b and the AlAs layer on the upper side of the upper level portion 42a, and the impurity concentration in the AlAs layer on the upper side of the upper level portion 42a is higher than the impurity concentration in the AlAs layer on the upper side of the step portion 42b.

Therefore, the oxidation rate of the AlAs layer on the upper side of the upper level portion 42a is lower than the oxidation rate of the AlAs layer on the upper side of the step portion 42b, so that the oxidation reaction apparently stops when the oxidation reaction reaches the AlAs layer on the upper side of the upper level portion 42a and, hence, the progress of oxidation of the AlAs layer on the upper side of the upper level portion 42a is autonomously restrained. This makes it easy to perform time control of the oxidation reaction.

Therefore, by time control of the oxidation reaction of the AlAs layer, it is possible to maintain the circular AlAs layer 64A on the upper side of the upper level portion 42a in an unoxidized state with an accurate shape and an accurate area.

In view of the above, by using the AlAs layer 64A on the upper side of the upper level portion 42a as a current injection region and using the Al oxide layer 64B on the upper side of the step portion 42b as a current confinement region, it is possible to form a current confinement layer having a controlled current injection region.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plane emission type semiconductor laser device comprising a lower reflector, a light emission layer, and an upper reflector having a current confinement layer, wherein
said plane emission type semiconductor laser device is formed on a stepped substrate comprising an upper level portion, a step portion, and a lower level portion lower than said upper level portion and surrounding said upper level portion with said step portion therebetween,
said current confinement layer comprises, on the upper side of said upper level portion of said stepped substrate, a current injection region comprised of an unoxidized high-Al-content layer having substantially the same shape as the plan-view shape of said upper level portion and substantially the same size as the size of said upper level portion,
said current confinement layer comprises, as a current confinement region, an annular Al oxide layer obtained by oxidizing the high-Al-content layer around said current injection region, and
said high-Al-content layer is doped with an n-type impurity in an impurity concentration of $1\times10^{17}$ to $1\times10^{18}$ cm$^{-3}$.

2. A plane emission type semiconductor laser device as set forth in claim 1, wherein said upper level portion of said stepped substrate is at a height of 0.1 to 5 μm from said lower level portion, with said step portion therebetween.

3. A plane emission type semiconductor laser device as set forth in claim 1, wherein said upper level portion and said lower level portion each have a (100) plane as the top face thereof.

4. A plane emission type semiconductor laser device as set forth in claim 1, wherein each of compound semiconductor layer constituting said lower reflector, said light emission layer, and said upper reflector including said current confinement layer is grown as flat layers on the upper side of said upper level portion of said stepped substrate and on the upper side of said lower level portion of said stepped substrate, and is grown as an inclined layer continuous with said flat layers on the upper side of said step portion of said stepped substrate.

5. A plane emission type semiconductor laser device as set forth in claim 1, wherein the plan-view shape of said upper level portion of said stepped substrate is substantially circular.

6. A plane emission type semiconductor laser device as set forth in claim 1, wherein said stepped substrate is a GaAs substrate, and said high-Al-content layer is an $Al_xGa_{(1-x)}As$ layer (where $1 \geq x > 0.95$).

7. A plane emission type semiconductor laser device as set forth in claim 1, wherein said lower reflector is of the n-type, and said upper reflector is of the p-type.

8. A method of manufacturing a plane emission type semiconductor laser device comprising a lower reflector, a light emission layer, and an upper reflector having a current confinement layer, comprising the steps of:

etching a substrate having a (100) plane as a major surface, to form a stepped substrate which comprises an upper level portion having the (100) plane as the top face thereof, said upper level portion having substantially the same shape and the same size as those of a current injection region of said current confinement layer, a step portion, and an annular lower level portion having the (100) plane, said lower level portion surrounding said upper level portion with said step portion therebetween, and epitaxially growing sequentially, on said stepped substrate, compound semiconductor layers for respectively constituting said lower reflector, said light emission layer, and said upper reflector having a high-Al-content layer, to form a laminate structure of said compound semiconductor layers in which each of said compound semiconductor layers is grown as flat layers on the upper side of said upper level portion of said stepped substrate and on the upper side of said lower level portion of said stepped substrate and is grown as an inclined layer continuous with said flat layers on the upper side of said step portion of said stepped substrate, wherein an n-type impurity is implanted into said high-Al-content layer at the time of growing said high-Al-content layer, and said method further comprises the steps of:

etching said upper reflector, said light emission layer, and an upper portion of said lower reflector, of said laminate structure formed, to form a mesa post, and subjecting said high-Al-content layer of said upper reflector to water vapor oxidation, to form an annular Al oxide layer extending inwards from the side surface of said mesa post and to maintain said high-Al-content layer in an unoxidized state in a central region corresponding to said upper level portion of said stepped substrate.

9. A method of manufacturing a plane emission type semiconductor laser device as set forth in claim 8, wherein when said n-type impurity is implanted into said high-Al-content layer being grown in said step of forming said laminate structure, the impurity concentration of said n-type impurity in said high-Al-content layer grown as said flat layer on the upper side of said upper level portion is made higher than the impurity concentration of said n-type impurity in said high-Al-content layer grown as said inclined layer on the upper side of said step portion.

* * * * *